US012764835B2

(12) United States Patent
Kezer et al.

(10) Patent No.: US 12,764,835 B2
(45) Date of Patent: Oct. 13, 2026

(54) DEVICE FOR CONNECTING A POWER SOURCE TO AN INDUCTOR

(71) Applicant: FIVES CELES, Lautenbach (FR)

(72) Inventors: Tony Kezer, Lautenbach (FR); Alain Mark, Lautenbach (FR)

(73) Assignee: FIVES CELES (FR)

( * ) Notice: Subject to any disclaimer, the term of this patent is extended or adjusted under 35 U.S.C. 154(b) by 1012 days.

(21) Appl. No.: 17/789,904

(22) PCT Filed: Dec. 30, 2020

(86) PCT No.: PCT/FR2020/052641

§ 371 (c)(1),
(2) Date: Jun. 29, 2022

(87) PCT Pub. No.: WO2021/136918

PCT Pub. Date: Jul. 8, 2021

(65) Prior Publication Data

US 2023/0061190 A1 Mar. 2, 2023

(30) Foreign Application Priority Data

Dec. 30, 2019 (FR) ...................................... 1915719

(51) Int. Cl.

| | |
|---|---|
| ***H05B 6/06*** | (2006.01) |
| ***H01G 4/38*** | (2006.01) |
| ***H01G 4/40*** | (2006.01) |
| ***H05K 7/20*** | (2006.01) |

(52) U.S. Cl.
CPC ................ *H05B 6/06* (2013.01); *H05K 7/20* (2013.01); *H01G 4/38* (2013.01); *H01G 4/40* (2013.01)

(58) Field of Classification Search
CPC .............. H05B 6/06; H05K 7/20; H01G 4/40
USPC .......................................................... 219/661
See application file for complete search history.

(56) References Cited

U.S. PATENT DOCUMENTS

| | | | | |
|---|---|---|---|---|
| 5,812,365 A | | 9/1998 | Jakoubovitch | |
| 5,940,263 A | * | 8/1999 | Jakoubovitch | H01G 11/82 361/689 |
| 6,399,929 B1 | * | 6/2002 | Hanton | H05B 6/104 219/661 |

FOREIGN PATENT DOCUMENTS

| | | | | |
|---|---|---|---|---|
| FR | 2687832 A1 | | 8/1993 | |
| FR | 2716033 A1 | * | 8/1995 | H01G 11/82 |
| WO | 9213355 A1 | | 8/1992 | |
| WO | 9629714 A1 | | 9/1996 | |

OTHER PUBLICATIONS

Machine Translation of FR2716033 (Year: 2025).*

* cited by examiner

*Primary Examiner* — John J Norton
*Assistant Examiner* — Thomas J Ward
(74) *Attorney, Agent, or Firm* — The Belles Group, P.C.

(57) ABSTRACT

A device for connecting a power source to an inductor, comprising at least three connection plates made of a conductive material and to which an arbitrary number of capacitors are electrically connected, the connection plates allowing an electrical connection between the power source and the inductor in a parallel, series or series-parallel configuration, characterized in that at least two connection plates are bent by substantially 90°, each forming two half-plates that are substantially perpendicular to one another, each half-plate being electrically connected to a different connection plate.

3 Claims, 9 Drawing Sheets

[Fig. 1]
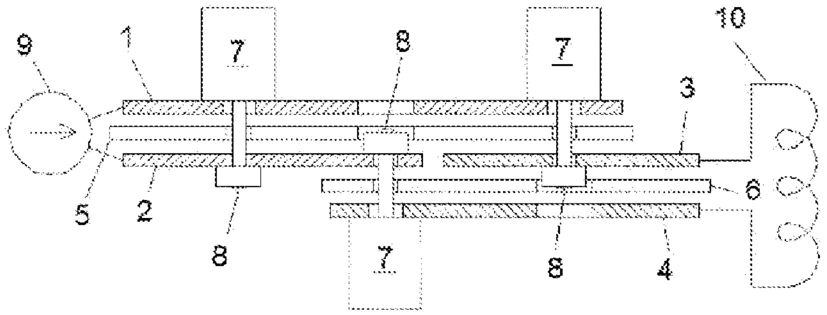
[Fig. 2]
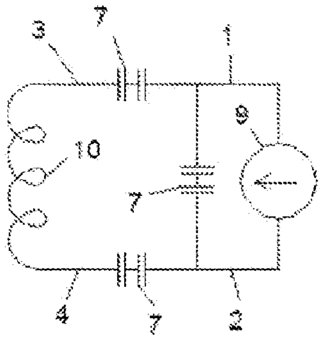

[Fig. 3]
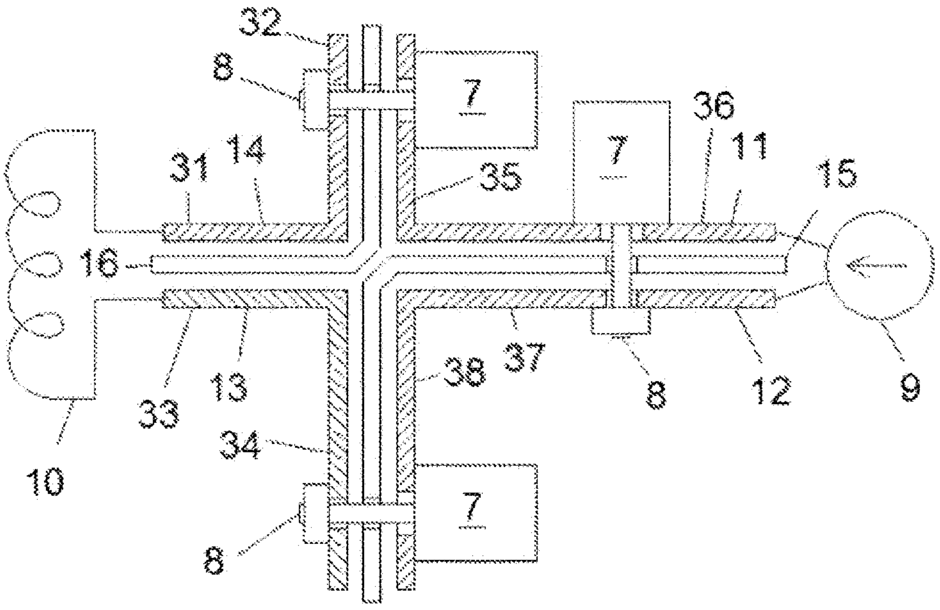
[Fig. 4]
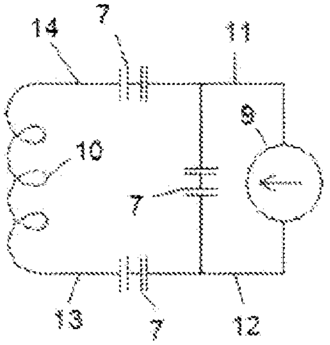

[Fig. 5]
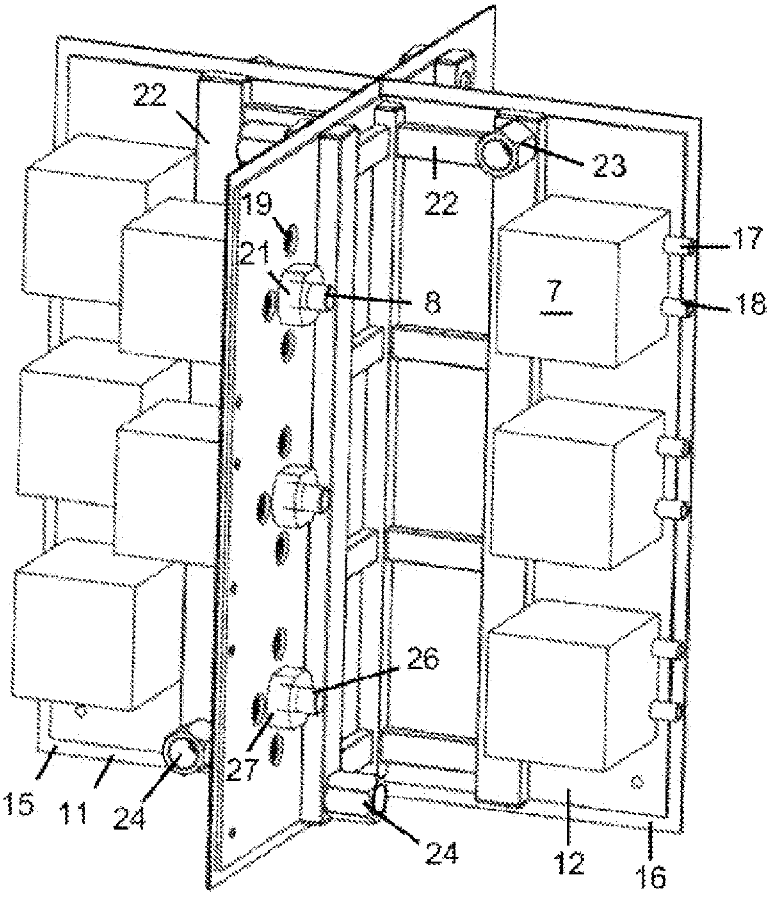

[Fig. 6]
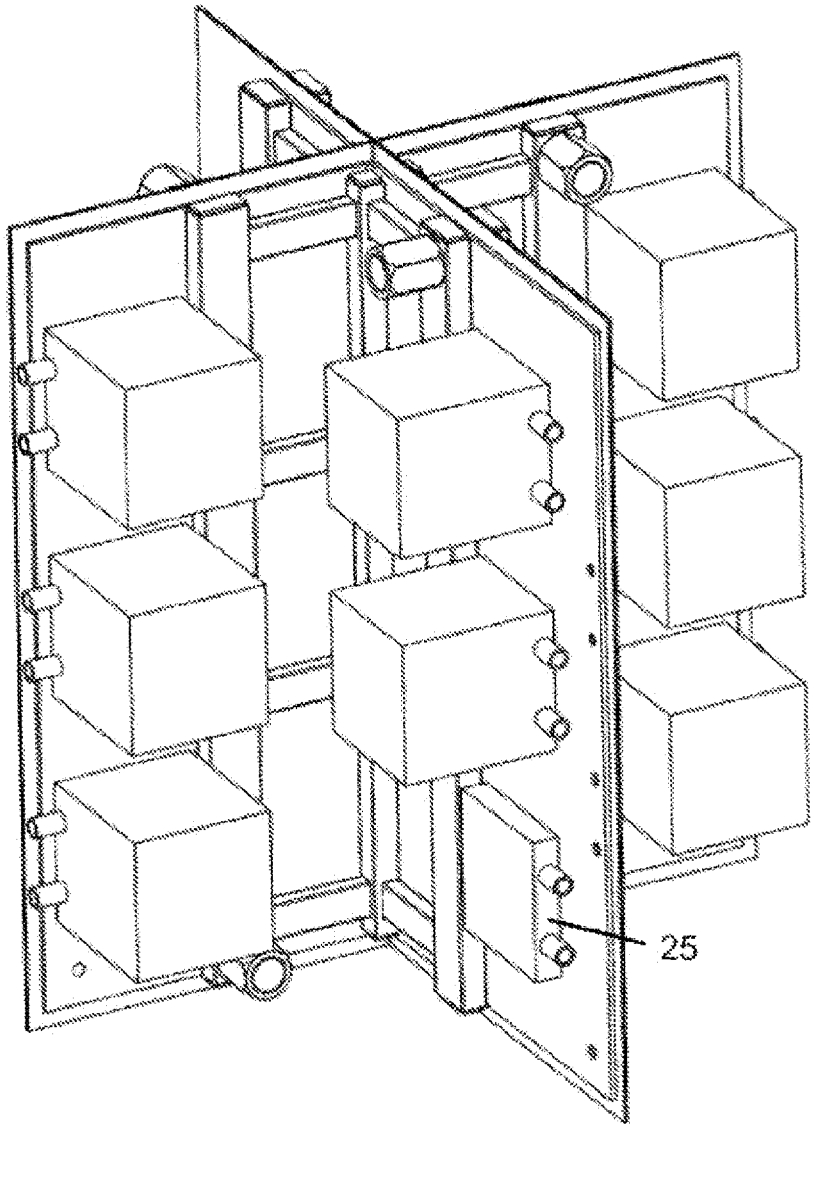

[Fig. 7]
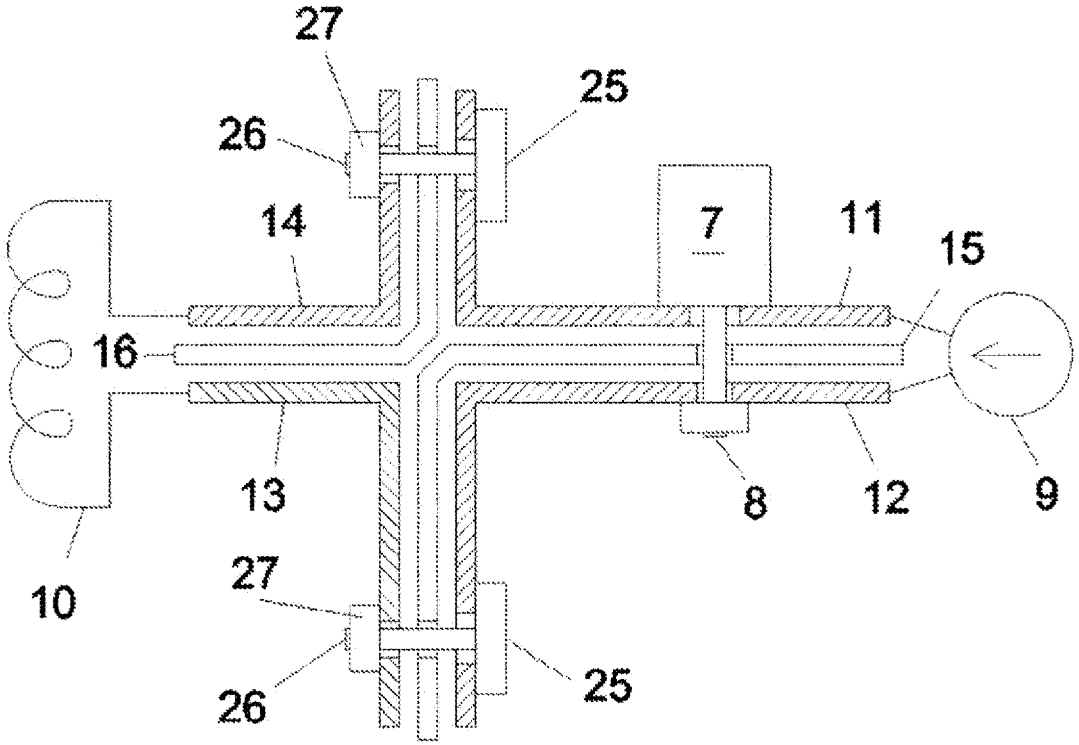
[Fig. 8]
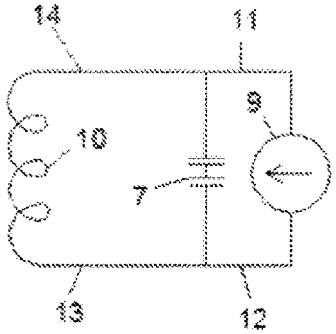

[Fig. 9]
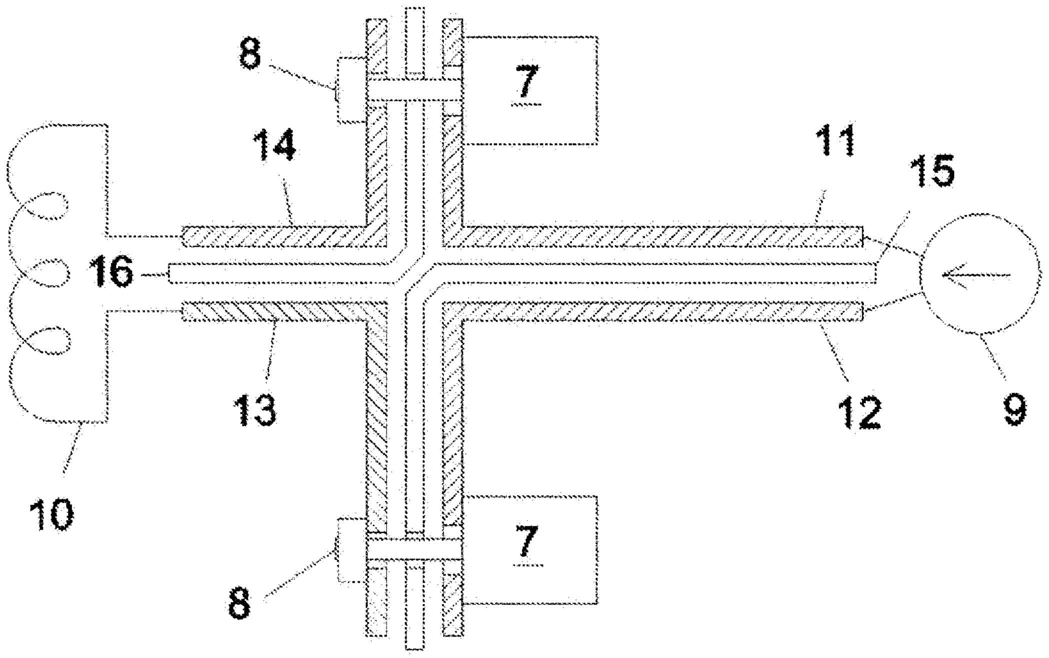
[Fig. 10]
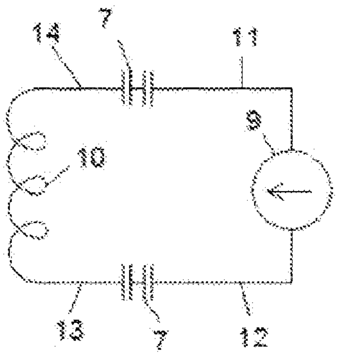

[Fig. 11]
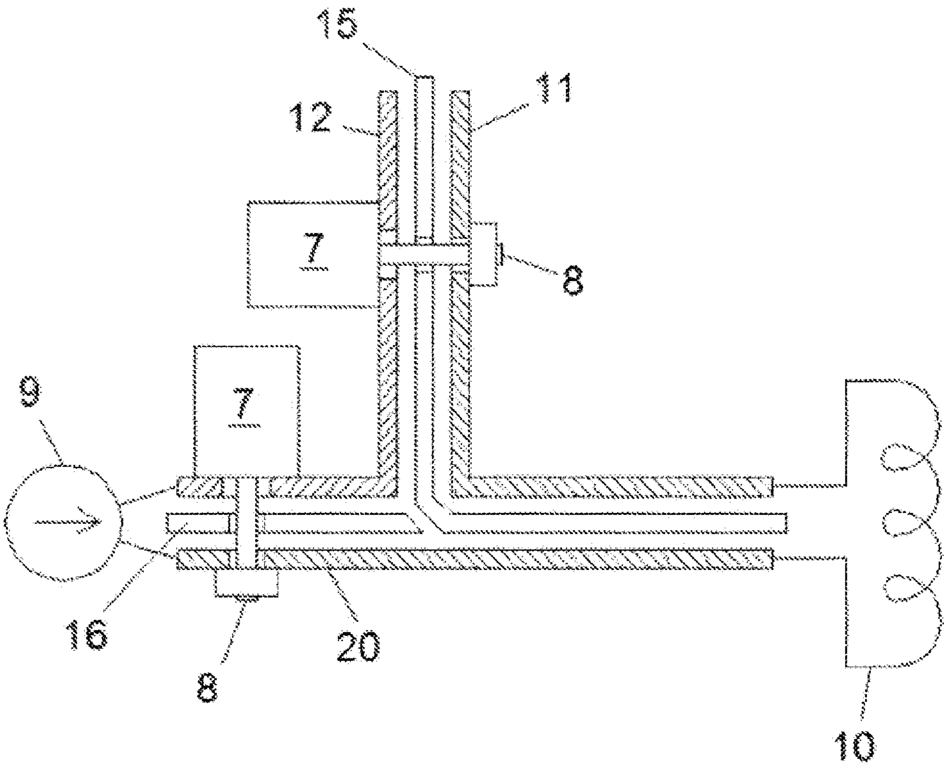
[Fig. 12]
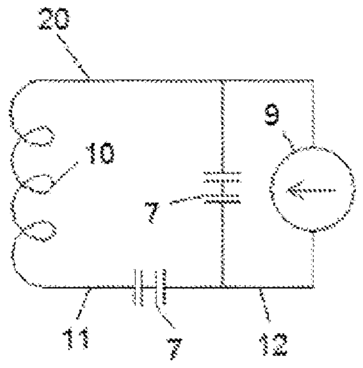

[Fig. 13]
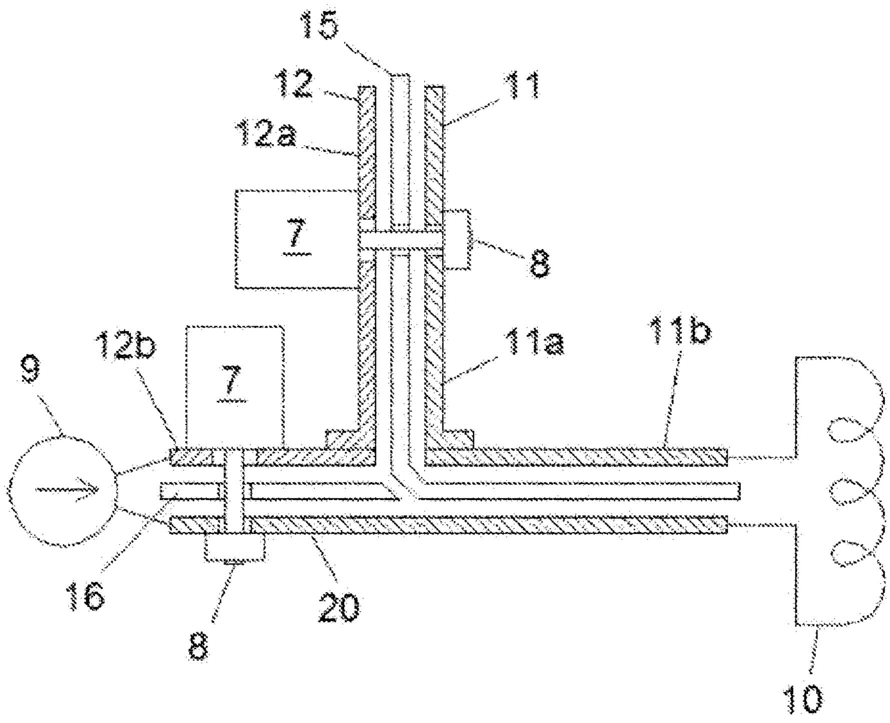
[Fig. 14]
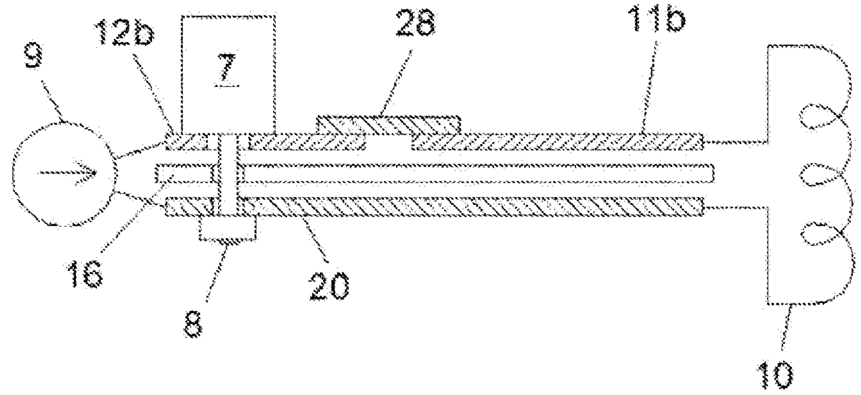

[Fig. 15]
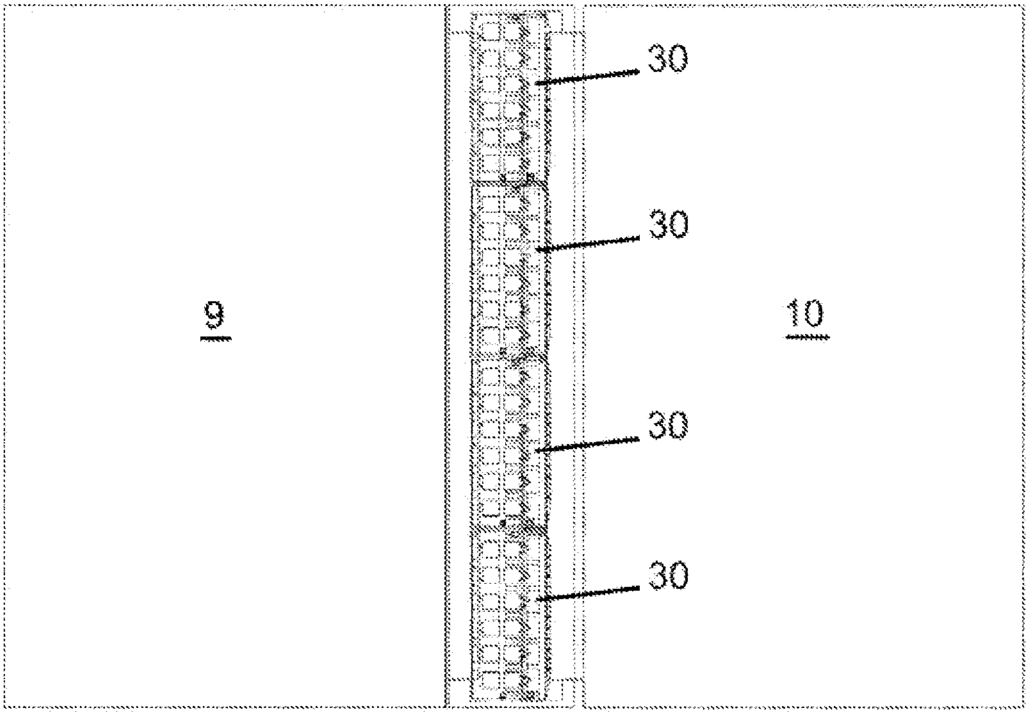

DEVICE FOR CONNECTING A POWER SOURCE TO AN INDUCTOR

CROSS-REFERENCE TO RELATED PATENT APPLICATIONS

The present application is a U.S. national stage application under 35 U.S.C. § 371 of PCT Application No. PCT/FR2020/052641 filed Dec. 30, 2020, which claims priority to French Patent Application No. 1915719 filed Dec. 30, 2019. The disclosures of the aforementioned priority applications are incorporated herein by reference in their entireties.

DESIGNATION OF THE RELEVANT TECHNICAL FIELD

The invention relates to devices for installing capacitors used in oscillating circuits of induction heating equipment.

Technical Problems Addressed by the Invention

Devices for installing capacitors in oscillating circuits comprise connection plates made of electrically conductive material, typically copper, on which capacitors are installed. A plurality of capacitors are generally installed on a plate, their number being linked to their unit capacitance, the total capacitance sought and the electrical characteristics of the oscillating circuit (voltage, current and frequency).

Current capacitor installation devices typically offer connection plates in parallel (in-line configuration) as illustrated schematically in FIG. 1 for a series-parallel configuration. To aid understanding of the installation principle based on this figure, as well as for FIGS. 3, 7, 9 and 11, the dimensions are not in proportion and the clearance between plates is greatly accentuated. In this figure, four connection plates 1, 2, 3, 4 are arranged in parallel, with two outer plates and two central plates arranged on the same plane. The device thus comprises two insulating plates. In this example, and in this cross-sectional view, two capacitors 7 are secured on a first outer plate 1 and another is secured on the second outer plate 4. Two central connection plates 2, 3 are arranged between the two outer plates 1, 4. An insulating plate 5, 6, for example made of Teflon®, is placed between the outer connection plates and the central connection plates. In a longitudinal view (not shown) of the device, a plurality of capacitors are connected over the height of the connection plates 1 and 4, the number of capacitors being linked to the characteristics of the installation. A capacitor comprises means for being secured on a connection plate, for example tapped holes for mounting with screws, and an electrical connection rod 8, for example threaded. The connection plates comprise holes in line with the electrical connection rods of the capacitors in order to allow said electrical connection rods to pass through. The diameter of the holes of the connection plates is chosen according to the diameter of the electrical connection rods such that it is large enough to prevent the current from passing between a rod of a capacitor and the plate on which it is secured, thus guaranteeing an electrical isolation distance. The length of the electrical connection rods of the capacitors is such that it allows connection to another connection plate. In this example, the capacitors of the outer plates 1, 4 are electrically connected to the central plates 2, 3 by means of nuts. The outer plates comprise holes in line with the electrical connection rods of the capacitors in order to allow said nuts as well as a key for securing same to pass through. A power source 9 is electrically connected to the plates 1 and 2 and an inductor 10 is electrically connected to the plates 3 and 4. FIG. 2 illustrates the electrical diagram corresponding to this example of a series-parallel configuration from FIG. 1.

In this type of in-line configuration, the two outer plates 1, 4 are separated by the presence of the central plates 2, 3 and the electrical insulation plates 5, 6.

The disadvantages of this type of configuration are as follows:

- Generation of a large self-inductance resulting from the large space between the two external connection plates (this self-inductance increases when the spacing between the plates increases).
- This self-inductance generates electrical losses, and therefore a reduction in efficiency, as well as a magnetic field generated by the current flowing in the connections, which heats the connection plates, thus requiring greater cooling (image of the electrical losses).
- Accessibility for operators to the various components for installation and maintenance is often complicated.

SUMMARY OF THE INVENTION

According to a first aspect of the invention, a device is proposed for connecting a power source to an inductor, comprising at least three connection plates made of conductive material and to which an arbitrary number of capacitors are electrically connected, the connection plates allowing an electrical connection between the power source and the inductor in a parallel, series or series-parallel configuration, characterized in that at least two connection plates are bent by substantially 90°, each forming two half-plates that are substantially perpendicular to one another, each half-plate being electrically connected to a different connection plate.

According to one possibility, one of the three connection plates may be substantially straight and be electrically connected to two different connection plates.

According to another possibility, the device may comprise four connection plates that are bent by substantially 90°, each forming two half-plates that are substantially perpendicular to one another, each half-plate being electrically connected to a different connection plate, the assembly substantially having a cross shape in a cross-sectional view.

The two connection half-plates of the same connection plate may be separated from two other connection half-plates of another connection plate by at least one plate made of insulating material and bent by substantially 90°.

Advantageously, the connection plates may comprise a cooling channel in which a cooling fluid circulates.

According to a second aspect of the invention, an induction heating installation is proposed, comprising a power source and an inductor, characterized in that the electrical connection between the power source and the inductor is produced by at least one device according to the first aspect of the invention, or one or more of its improvements.

The invention makes it possible to reduce to a negligible level the inductance in the connections and, consequently, the magnetic field generated by the currents circulating in the connections.

BRIEF DESCRIPTION OF THE FIGURES

Other features and advantages of the invention will become apparent from the detailed description that follows, for the understanding of which reference is made to the appended drawings, in which:

FIG. 1 is a schematic cross-sectional view of an in-line configuration of connection plates according to the prior art, for a series-parallel configuration of capacitors.

FIG. 2 is a schematic view of the electrical block diagram corresponding to the series-parallel configuration in FIG. 1.

FIG. 3 is a schematic cross-sectional view of a cross-shaped configuration of connection plates according to an embodiment of the invention, for a series-parallel configuration of capacitors.

FIG. 4 is a schematic view of the electrical block diagram corresponding to the series-parallel configuration in FIG. 3.

FIG. 5 is a schematic three-dimensional view from a first perspective of a cross-shaped configuration of connection plates according to an embodiment of the invention, for a series-parallel configuration of the capacitors.

FIG. 6 is a schematic three-dimensional view of the cross-shaped configuration from FIG. 4 from a second perspective.

FIG. 7 is a schematic cross-sectional view of a cross-shaped configuration of connection plates according to an embodiment of the invention, for a parallel configuration of capacitors.

FIG. 8 is a schematic view of the electrical block diagram corresponding to the parallel configuration in FIG. 7.

FIG. 9 is a schematic cross-sectional view of a cross-shaped configuration of connection plates according to an embodiment of the invention, for a series configuration of capacitors.

FIG. 10 is a schematic view of the electrical block diagram corresponding to the parallel configuration in FIG. 9.

FIG. 11 is a schematic cross-sectional view of a T-shaped configuration of connection plates according to an embodiment of the invention, for a series-parallel configuration of capacitors.

FIG. 12 is a schematic view of the electrical block diagram corresponding to the configuration in FIG. 11.

FIG. 13 is a schematic cross-sectional view of an alternative embodiment of a T-shaped configuration of connection plates from FIG. 11, shown here in series-parallel configuration.

FIG. 14 is a schematic cross-sectional view of the alternative embodiment of a T-shaped configuration of connection plates according to FIG. 13, shown here in parallel configuration.

FIG. 15 is a longitudinal schematic view of an example application of the invention.

Since the embodiments described hereinafter are not limiting in nature, it is possible in particular to consider variants of the invention that comprise only a selection of the features that are described, provided that this selection of features is sufficient to confer a technical advantage or to differentiate the invention from the prior art. This selection comprises at least one preferably functional feature without structural details, or with only a portion of the structural details if this portion alone is sufficient to confer a technical advantage or to differentiate the invention from the prior art.

In the remainder of the description, elements having an identical structure or similar functions will be designated by the same references.

DETAILED DESCRIPTION OF THE INVENTION

FIG. 3 schematically illustrates, in cross section, a configuration of connection plates for a series-parallel configuration according to an embodiment of the invention. The basic electrical diagram for this, shown in FIG. 4, is therefore similar to that shown in FIG. 2. As can be seen in this figure, the four connection plates 11, 12, 13, 14 are bent at right angles and the assembly substantially forms a cross in a cross-sectional view. Thus, the connection plates are only spaced apart by the thickness of an insulating plate 15, 16, no connection plate being arranged between the outer plates. The distance between two connection plates is thus reduced to the strict minimum linked to the thickness of the insulating plate required for providing electrical insulation between the plates. Again, in a longitudinal view (not shown) of the device, a plurality of capacitors are connected over the height of the connection plates 11 and 12, the number of capacitors being linked to the characteristics of the installation.

The advantages of this type of configuration are as follows:

- Negligible self-inductance due to optimum electrical compensation on account of a reduced distance between connection plates,
  which generates very little electrical loss, resulting in very good efficiency.
- A weak magnetic field generated by the current flowing in the connections, resulting in little heating in the connection plates, thus requiring little cooling.
- Easy accessibility for operators to the various components for installation and maintenance.
- Optimum electrical balancing.

Advantageously, the insulating plates 15, 16 are also bent at right angles, thus preventing any risk of an electric arc in the center of the cross that would result from the use of straight plates. Indeed, as shown in FIG. 3, the bent insulating plates ensure a perfect continuity of insulating material in the center of the cross, whereas straight plates would lead to a discontinuity of insulating material at the intersections of the center of the cross, thus creating a risk of leakage paths at the points where the insulating material could be insufficient, i.e. at the junction of two plates. To facilitate the bending of the insulating plates by 90°, it may be advantageous to use two plates of half-thickness instead of a single plate, which would be more difficult to bend. Therefore, it is possible, for example, to use two Teflon® plates having a thickness of 1 mm in place of a plate measuring 2 mm thick.

FIGS. 5 and 6 illustrate, in a longitudinal view, another example of a capacitor installation device having connection plates in the shape of a cross and a series-parallel configuration according to the invention, from two different viewing angles. In the three-dimensional drawings of these figures, the dimensional proportions of the components are closer to reality than in FIGS. 1 and 3. The assembly includes a set of 8 capacitors. These are cooled by a flow of cooling water. For this purpose, each capacitor comprises a first connection 17 for the cooling water supply and a second connection 18 for the water outlet. The capacitors can all be connected in series to the same cooling water circuit, or they can be connected individually or in groups of capacitors, each group being connected in parallel to the cooling circuit. A capacitor comprises a base made of electrically conductive material, for example copper, by which it is secured to a connection plate by means of four screws 19. This thus produces electrical continuity between the connection plate and the capacitor. A capacitor comprises a threaded rod 8 for electrical connection with another connection plate by means of a nut 21 on which said capacitor is tightened. The connection plates comprise a cooling channel 22 in which cooling water circulates. Due to the limited heating of the connection plates, the cooling channel only covers part of the surface of a plate, i.e. the part where the electrical current is strongest, as can be seen in FIGS. 5 and 6. The capacitors also contribute to the cooling of the connection plates due to their water-cooled base. This channel 22 comprises a first connection 23 for the cooling water supply and a second connection 24 for the water outlet. The cooling channels 22 of the connection plates may all be connected in series to the same cooling water circuit, or they may be connected in parallel. The cooling channels 22 of the connection plates may be connected in series on the same cooling water circuit as the capacitors, or they may be connected on a separate circuit. The connection plates 11 and 12 are electrically connected via two compensators 7 and via a shunt ring 25, which is visible in FIG. 6. This cooled ring is secured on the plate 11 by means of four screws, like the capacitors, and it also comprises a threaded rod 26 for electrical connection with the plate 12 by means of a nut 27 on which it is tightened. The electrical connections between the connection plates via capacitors 7 or rings 25 make it possible to easily transition from a configuration of the series-parallel type, to a series configuration or a parallel configuration.

FIG. 7 illustrates another embodiment of the invention comprising four connection plates installed in the shape of a cross with a parallel configuration. In this sectional view, this example comprises a capacitor 7 and two shunt rings 25. Again, the total number of longitudinally arranged capacitors and rings depends on the desired characteristics. The equivalent electrical diagram is shown in FIG. 8.

FIG. 9 illustrates another exemplary embodiment of the invention comprising four connection plates installed in the shape of a cross with a series configuration. In this sectional view, this example comprises two capacitors 7. As before, the total number of longitudinally arranged capacitors and rings depends on the desired characteristics. The equivalent electrical diagram is shown in FIG. 10.

FIG. 11 illustrates another exemplary embodiment of the invention in the shape of a "T" comprising three connection plates. In this setup, two of the connecting plates 11, 12 are bent by 90° while the third 20 is straight. The equivalent electrical diagram, in series-parallel, is shown in FIG. 12. It retains all the advantages of the invention, in particular due to a distance between each pair of connection plates that has been reduced to the minimum possible.

In an alternative embodiment shown in FIG. 13, the bent plates 11, 12 are formed in two parts, 11*a*, 11*b*, 12*a*, 12*b*. They are secured to one another by means of screws and nuts. This setup makes it possible to easily remove the capacitor in series and therefore to transition to a parallel configuration only. It is intended for applications for which flexibility is required during use (modification of the adaptation of the power source—inductor—part), which may be necessary if very varied parts are heated. For the transition from a series-parallel configuration to a parallel configuration, the parts 11*a*, 12*a* are removed. They are replaced by a connecting piece 28, as shown in FIG. 14, secured by means of screws and bolts.

The invention applies in particular to the following conditions:

Frequency: medium frequency (from 15 kHz to 2 MHz)
Input voltage: typically less than 1 kV
Output voltage: up to 8 kV (voltage increase)
Output current: up to 50 kA
Electrical power for an installation device: >100 kW FIG. 15 schematically illustrates, in a front view, an example application of the invention for connecting a power source to an inductor intended to heat a moving metal strip in a continuous annealing line. To transmit the required power to the installation, the connection between the power source 9 and the inductor 10 is produced by four devices 30 in a cross-shaped configuration according to the invention, the characteristics of which are as follows:

Series-parallel configuration
Number of capacitors: 72 (4 modules of 18 capacitors)
Supply voltage: 500V
Output voltage: 2500-3000V
Output current: 40 kA
Reactive power: 4 MW As can be seen here in FIG. 15, the implementation of the invention allows for compact installation of the heating installation, the distance between the power source and the inductor being limited thanks to the compactness of the capacitor installation device due to the elimination of straight connection plates.

As will be readily understood, the invention is not limited to the examples that have just been described, and numerous modifications may be made to these examples without departing from the scope of the invention. In addition, the various features, forms, variants, and embodiments of the invention may be grouped together in various combinations as long as they are not incompatible or mutually exclusive.

The invention claimed is:

1. A device for connecting a power source to an inductor, comprising four connection plates made of conductive material and to which a number of capacitors are electrically connected, the connection plates allowing an electrical connection between the power source and the inductor in a parallel, series or series-parallel configuration, wherein the connection plates are bent by substantially 90°, each forming two half-plates that are substantially perpendicular to one another, each half-plate being electrically connected to a different connection plate, the assembly substantially having a cross shape in a cross-sectional view, wherein the two connection half-plates of the same connection plate are separated from two other connection half-plates of another connection plate by at least one plate made of insulating material and bent by substantially 90°.

2. The device according to claim 1, wherein the connection plates comprise a cooling channel in which a cooling fluid circulates.

3. An induction heating installation, comprising a power source and an inductor, wherein an electrical connection between the power source and the inductor is produced by at least one device according to claim 1.

* * * * *